United States Patent [19]

Heinen et al.

[11] Patent Number: 5,362,680
[45] Date of Patent: Nov. 8, 1994

[54] TECHNIQUE FOR ENHANCING ADHESION CAPABILITY OF HEAT SPREADERS IN MOLDED PACKAGES

[75] Inventors: Katherine G. Heinen, Dallas; Brenda C. Gogue, Richardson, both of Tex.; Henry F. Breit, Attleboro, Mass.

[73] Assignee: Texas Instruments Incorporated, Dallas, Tex.

[21] Appl. No.: 931,797

[22] Filed: Aug. 18, 1992

[51] Int. Cl.$^5$ .............................. H01L 21/60
[52] U.S. Cl. .................. 437/209; 437/207; 437/211; 437/217; 437/219
[58] Field of Search ............... 437/209, 211, 217, 219, 437/207; 148/DIG. 138; 257/720, 699, 671

[56] References Cited

U.S. PATENT DOCUMENTS

| | | |
|---|---|---|
| 3,821,039 | 6/1974 | Ettenberg .................. 148/DIG. 138 |
| 4,542,401 | 9/1985 | Sekiba ................................ 437/209 |
| 4,874,722 | 10/1989 | Bednarz et al. ..................... 437/209 |
| 4,943,844 | 7/1990 | Oscilowski et al. .................. 357/74 |
| 5,050,040 | 9/1991 | Gondusky et al. ................. 257/720 |
| 5,053,357 | 10/1991 | Lin et al. ........................... 437/211 |
| 5,073,521 | 12/1991 | Braden ............................... 437/219 |
| 5,087,962 | 2/1992 | deVos et al. ....................... 257/671 |
| 5,138,114 | 8/1992 | Breit et al. ......................... 257/699 |

FOREIGN PATENT DOCUMENTS

| | | |
|---|---|---|
| 0113088 | 11/1984 | European Pat. Off. . |
| 0478240 | 1/1992 | European Pat. Off. . |
| 61137351 | 7/1984 | Japan . |
| 60-110146 | 10/1985 | Japan . |
| 60-137041 | 11/1985 | Japan . |
| 61-0003438 | 5/1986 | Japan . |

OTHER PUBLICATIONS

Data Sheet "Comparison of Major Thermal-Spray Coating Process", Advanced Materials & Processes Feb. 1992, pp. 58–59.
Texas Instruments Incorporated Brochure "Plastic Cavity Package", 1989, Dallas, Texas.
MQUAD Package "A New High Performance Metal Quad Flat Pack", Olin Interconnect Technologies, 1991.

Primary Examiner—Tom Thomas
Assistant Examiner—Kevin M. Picardat
Attorney, Agent, or Firm—Alan K. Stewart; Richard L. Donaldson; William E. Hiller

[57] ABSTRACT

Adhesion between a heat spreader (15) and a substance (19) to be adhered to the heat spreader can be enhanced by using thermal spray deposition to apply a coating (23) to the heat spreader. The substance to be adhered is applied to the coated heat spreader.

19 Claims, 3 Drawing Sheets

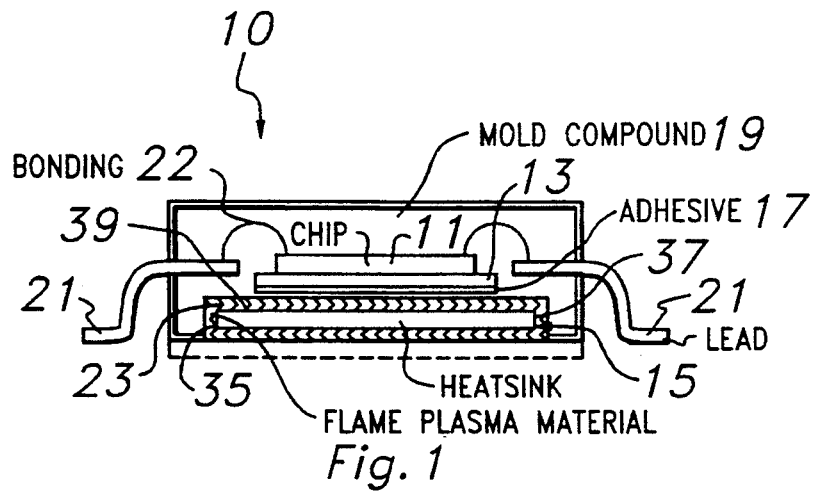
Fig. 1
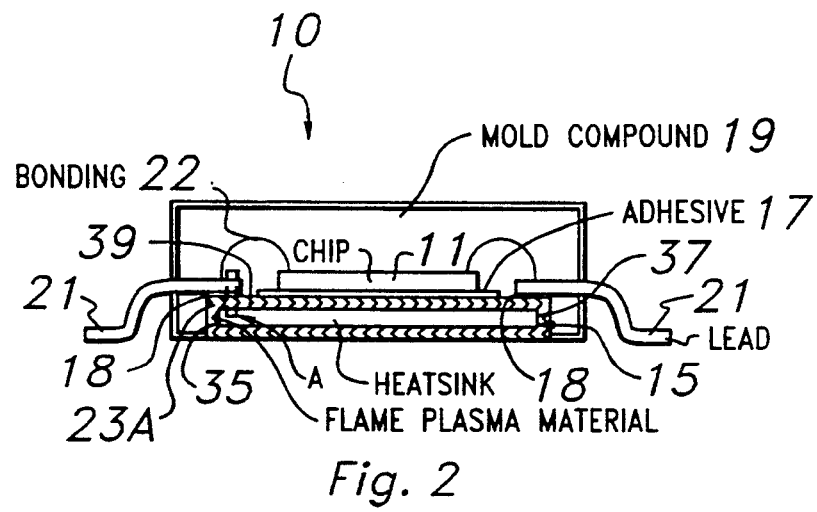
Fig. 2
| MOLDING COMPOUND | 19 |
| FLAME PLASMA DEPOSITED FILM | 23B |
| LEAD | 21 |
| FLAME PLASMA DEPOSITED FILM | 23B |
| ADHESIVE | 18 |
| FLAME PLASMA DEPOSITED FILM | 23A |
| HEAT SINK/SPREADER | 15 |
Fig. 2a
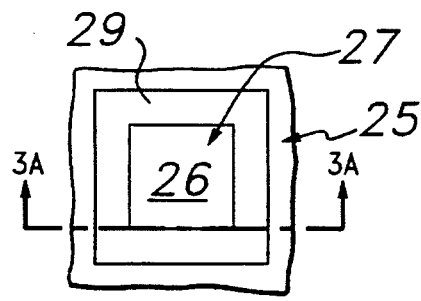
Fig. 3
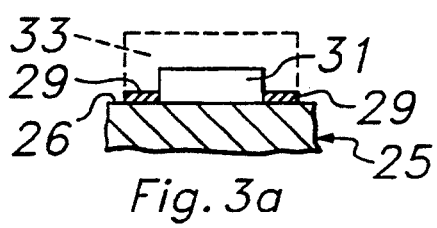
Fig. 3a

| MOLD COMPOUND | 45 |
|---|---|
| ADHESIVE | 51 |
| FLAME PLASMA DEPOSITED FILM | 55 |
| HEAT SPREADER/LID | 49 |

| HEAT SPREADER/LID | 47 |
|---|---|
| FLAME PLASMA DEPOSITED FILM | 53 |
| ADHESIVE | 52 |
| FLAME PLASMA DEPOSITED FILM | 61 |
| DIE PAD | 57 |
| FLAME PLASMA DEPOSITED FILM | 61 |
| ADHESIVE | 52 |
| CHIP | 59 |

| HEAT SPREADER/LID | 47 |
|---|---|
| FLAME PLASMA DEPOSITED FILM | 53 |
| ADHESIVE | 51 |
| MOLD COMPOUND | 45 | ns
TECHNIQUE FOR ENHANCING ADHESION CAPABILITY OF HEAT SPREADERS IN MOLDED PACKAGES

CROSS REFERENCE TO RELATED APPLICATION

The subject matter of this application is related to the subject matter of copending U.S. Ser. No. 07/587,189, filed on Sep. 24, 1990 and assigned to the assignee of the present application.

FIELD OF THE INVENTION

This invention relates generally to molded packages such as those used in integrated circuit packaging and, more particularly, to a packaging technique which reduces the likelihood of delamination and package cracking by enhancing the adhesion between the molding compound and the heat spreader within such packages.

BACKGROUND OF THE INVENTION

Integrated circuit chips are being fabricated with ever smaller geometries and higher circuit densities. The power consumption associated with these increased circuit densities has also increased, thereby increasing the thermal transport requirements of the package. In some conventional thermal transport arrangements, the integrated circuit chip is supported on a metal or ceramic heat spreader. The chip and heat spreader are overmolded by a plastic molding compound which serves as a casing for the package. The thermal impedance of such conventional arrangements has become marginal in view of the increased thermal transport requirements of the higher circuit density packages. This is true even for CMOS technology.

One problem with the conventional arrangement is poor adhesion of the molding compound to the heat spreader surface, particularly with a metal heat spreader. This problem arises because the molding compounds include a mold release agent which permits removal of the molded part from the mold without using an external mold release material. The mold release agent in the molding compound reduces the adhesion between the molding compound and the mold, but also disadvantageously reduces the adhesion between the molding compound and the surface of the metal heat spreader. This poor adhesion often contributes to package cracking due to delamination between the molding compound and the heat spreader.

For example, during conventional surface mounting using reflow soldering, the temperatures (215 C. to 260 C.) produced can enhance the state of thermal mismatch between the molding compound and the heat spreader. The problem is much further aggravated if moisture is present in the molding compound, because the moisture is converted to steam at reflow soldering temperatures. The steam pressure causes more severe delamination and package cracking.

In addition, delamination and cracking as described above can even be caused by temperature excursions within the normal operating temperature of the package.

In view of the foregoing discussion, it is desirable to improve the adhesion between the molding compound and the heat spreader in order to provide increased resistance to delamination and package cracking, while also providing adequate thermal transport capability.

According to the present invention, adhesion between a heat spreader and a substance to be adhered to the heat spreader can be enhanced by using thermal spray deposition to apply a coating to the heat spreader. The substance to be adhered is applied to the coated heat spreader. Such coatings can also be applied to other metal elements within the package to enhance their adhesion capability.

BRIEF DESCRIPTION OF THE DRAWINGS

Exemplary embodiments of the present invention are described below in conjunction with the appended drawings, in which:

FIG. 1 is a cross-sectional view of an integrated circuit device package according to one embodiment of the present invention;

FIG. 2 is a cross-sectional view of an integrated circuit device package according to another embodiment of the present invention;

FIG. 2A is a diagrammatic illustration of detail A in FIG. 2;

FIG. 3 is a fragmentary plan view of a coated heat spreader according to the present invention;

FIG. 3A is a fragmentary sectional view taken along line 3A—3A in FIG. 3, and showing the semiconductor die and molding compound in place on the heat spreader;

DETAILED DESCRIPTION

Figures 4, 4A, 4B, 4C:
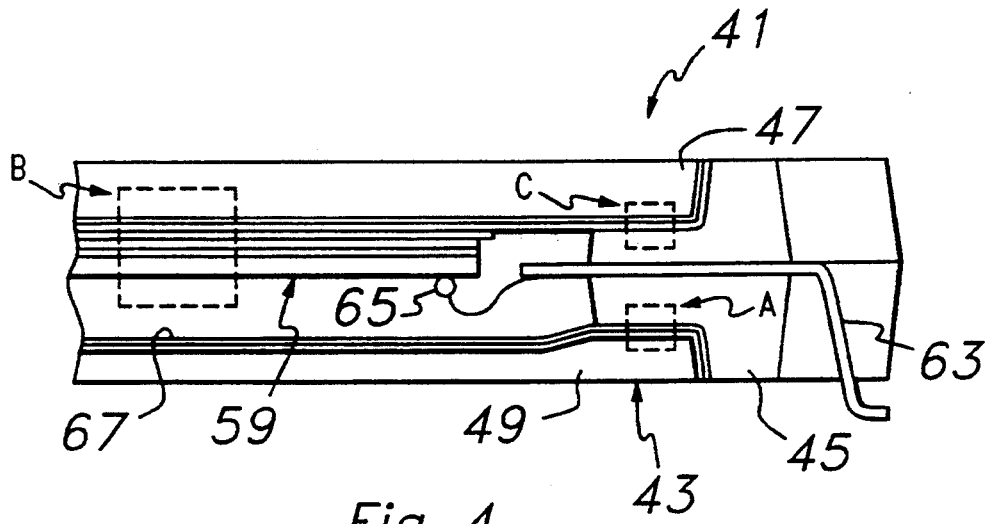
FIG. 4 is a fragmentary side view of an integrated circuit device package according to another embodiment of the present invention.
FIG. 4A is a diagrammatic illustration of detail A in FIG. 4.
FIG. 4B is a diagrammatic illustration of detail B in FIG. 4.
FIG. 4C is a diagrammatic illustration of detail C in FIG. 4.

FIG. 1 illustrates an electrical circuit assembly according to one embodiment of the present invention. In this embodiment, the electrical circuit assembly is an integrated circuit package 10 including an electrical circuit as embodied by integrated circuit chip 11. The integrated circuit chip 11 is mounted on a chip support pad 13, and the chip support pad 13 is mounted on a heat spreader or heat sink 15. The pad 13 is adhered to the heat spreader 15 by an adhesive material 17. The heat spreader is preferably a metal heat spreader, for example, copper. The adhesive material 17 is preferably a thermally enhanced epoxy adhesive. Leads 21 are wire bonded to the chip 11, and a molding compound 19 is molded onto the chip 11, pad 13, heat spreader 15, leads 21 and wire bonds 22. The molding compound is typically a plastic material, for example, epoxy Novolac. The leads 21 are partially encapsulated by the molding compound 19 and project externally therefrom, thereby providing external electrical access to the chip 11.

Because of thermal mismatch between the heat spreader 15 and the molding compound 19, undesirable delamination between the heat spreader 15 and the molding compound 19 can occur, resulting in the package cracking problems described above. The present invention attempts to eliminate this problem by providing the heat spreader 15 with a relatively thin film coating 23 applied by a thermal spray coating process, for example, a coating of nickel aluminide applied by a flame plasma deposition process and having a thickness in the range of about 0.001 to 0.005 inches and having an adhesion strength of approximately 1000 psi, measured in shear. The coating 23 significantly enhances the adhesion between the molding compound 19 and the heat spreader 15, thereby reducing the likelihood of delamination therebetween. This technique can enhance the adhesion by ten-fold or more, depending on factors such as the intrinsic adhesion capability of the heat spreader surface to which the coating 23 is applied.

Because of the very good adhesion obtained, thermal transport is enhanced by elimination of gaps or voids between the molding compound 19 and the heat spreader 15. The coating 23 provides adhesion strength of about 1000 psi or more at the interface between the heat spreader 15 and the coating 23, at the interface between the coating 23 and the molding compound 19, and within the coating 23 itself. These interfacial adhesion strengths can be retained over the temperature range required for assembling the integrated circuit package 10 into a system, for example by reflow soldering, and over the required operational temperature range of the package 10. These strengths are retained through reflow soldering even when moisture is present in the molding compound 19. This greatly reduces the incidence of delamination and package cracking.

The film coating 23 should be thin enough to avoid cohesive failure in the coating itself, and should also be thin enough to avoid substantial sacrifices in thermal conductivity. The above-described example of coating 23 meets these requirements.

The flame plasma deposition process, also known as plasma arc deposition and plasma spray, is a well known thermal spray coating process, and a coating having the characteristics of the above-described exemplary coating 23 can be readily obtained using this process. In the flame plasma deposition process, a plasma-forming gas (e.g. argon or nitrogen) is used both as a heat source and a propelling agent for the coating material. The gas is ionized by a high-voltage arc struck between an anode and a cathode of a spray gun and is then forced through a nozzle. As the gas leaves the nozzle, it reverts to its natural state and liberates a large amount of heat. The coating material, such as nickel aluminide, is provided in powdered form and is injected into the hot gas stream where it is melted and projected at high velocity onto the heat spreader 15. The resultant nickel aluminide coating 23 is dense and strongly bonded to the heat spreader 15. Nickel aluminide is often referred to as a bond coat material because it will actually make a metallurgical weld to the surface of the heat spreader 15 during the flame plasma deposition process, and no pre-treating of the heat spreader is necessary.

Although flame plasma deposition is the preferred method of applying the coating material, other known thermal spray processes can be used to apply the coating material.

Referring again to FIG. 1, the leads 21 are electrically isolated from the heat spreader 15 by the molding compound 19. Therefore, the coating 23 may be either electrically conductive or insulative. The above-described nickel aluminide coating is electrically conductive.

The embodiment of FIG. 2 is generally similar to the FIG. 1 embodiment (and the same reference numerals have been used in FIG. 2 to designate analogous parts) except that the chip 11 and the leads 21 are attached directly to the heat spreader 15. The chip 11 is attached to the heat spreader 15 using the aforementioned adhesive 17. The leads 21 are attached to heat spreader 15 using adhesive 18. In this embodiment, the coating 23A could be electrically insulative to prevent the leads 21 from being shorted together by the metal heat spreader 15. Thus, in the FIG. 2 embodiment, the coating 23A could be, for example, any of a variety of well known insulating oxide materials. One specific example of an acceptable insulating oxide coating material is alumina. In order to obtain the desired adhesion between the heat spreader 15 and the alumina coating, however, it may be necessary to pre-treat the heat spreader 15 before depositing the alumina. One pre-treatment possibility is to mechanically abrade the heat spreader surface and then use flame plasma deposition to apply the desired coating of alumina onto the abraded heat spreader surface. Pre-treatment of a substrate by mechanical abrasion is a well known procedure in flame plasma deposition technology. As another pre-treatment possibility, the heat spreader 15 can be provided with a precoat layer of flame plasma deposited nickel aluminide. Thereafter, an overcoat layer of flame plasma deposited alumina can be applied to the precoated heat spreader to obtain the desired insulative coating.

As an alternative in the FIG. 2 embodiment, adhesive 18 can be an electrically insulating tape with adhesive on both sides. The insulating tape would prevent the leads 21 from shorting together, and the heat spreader 15 could be coated with an electrically conductive material if desired.

As mentioned above, the coatings 23 and 23A can be either insulative or conductive. Therefore, either of the aforementioned exemplary materials, nickel aluminide or alumina, may be used for the coatings 23 and 23A. However, bond coat type materials are generally preferable in terms of cost and thermal transport. Therefore, among the disclosed exemplary coating materials, nickel aluminide would be the generally recommended choice unless an insulating material is required.

Referring to FIG. 2A, the leads 21 may also be coated with a flame plasma deposited film 23B to enhance adhesion of the leads 21 to the molding compound 19 and to the adhesive 18. The flame plasma deposited film 23A on the heat spreader 15 also enhances the adhesion between heat spreader 15 and adhesives 17 and 18.

FIGS. 3 and 3A illustrate the use of the present invention with the heat spreader of a conventional TO-220 power transistor package. The heat spreader 25, copper in this embodiment, is provided with a flame plasma deposited alumina coating 29 which has been selectively positioned on the upper surface 26 of the heat spreader 25 by line of sight masking outside of the die attach area 27. The coating 29 can have the same thickness and adhesion strength as disclosed above with respect to the coating 23 of FIG. 1. The placement of the semiconductor die 31 and molding compound 33 is shown in FIG. 3A. In this embodiment, the molding compound 33 contacts only a limited portion of the upper surface 26 of the heat spreader 25, and the coating 29 is therefore limited to that particular portion of the upper surface 26. As indicated previously, the coating 29 may include a precoat layer of nickel aluminide and an overcoat layer of alumina.

On the other hand, the molding compound 19 in FIGS. 1 and 2 contacts all of the heat spreader 15 except the bottom surface and the chip attach area. The coatings 23 and 23A must therefore be applied to a significantly larger portion of the heat spreader surface area than in FIGS. 3 and 3A. For example, surfaces such as side surfaces 35 and 37 in FIGS. 1 and 2 must be coated in addition to the upper surface 39. In fact, the heat spreader 15 can be entirely encapsulated by the molding compound 19, as shown in broken lines in FIG. 1. In this case, even the bottom surface of the heat spreader 15 would be coated to promote adhesion of the molding compound 19.

Referring again to the arrangement illustrated in FIGS. 3 and 3A, scanning acoustical microscopy has been used to compare this structure to the conventional arrangement, which has no coating 29. The comparison was made both before and after temperature cycling, and the adhesion provided by the structure of FIGS. 3 and 3A was much improved over the conventional arrangement, even though the alumina coating 29 was not optimized and the heat spreader 25 was not precoated with a bond coat material.

The molding compound 33 of FIG. 3A can be molded onto the heat spreader 25 so that molding compound 33 covers heat spreader 25 in generally the same manner that molding compound 19 covers heat spreader 15 in FIGS. 1 and 2. The coverage of coating 29 in FIGS. 3 and 3A would be extended in correspondence to the extended coverage of the molding compound 33.

The coating 29 of FIGS. 3 and 3A may also be extended to cover the entire upper surface 26 of heat spreader 25, including the die attach area 27. This would provide isolation for the semiconductor die 33 and enhance the adhesion between the die attach adhesive (preferably a thermally enhanced epoxy adhesive) and the coated heat spreader 25. Such enhanced adhesion can reduce the amount of die attach adhesive needed, resulting in improved heat transfer from the die 33 to the heat spreader 25.

Referring to FIGS. 1 and 2, by coating the entire upper surface 39 of the heat spreader 15, the aforementioned advantages associated with coating the die attach area can be realized in the embodiments of FIGS. 1 and 2 also.

Another embodiment of the present invention is illustrated in FIGS. 4, 4A, 4B and 4C. FIG. 4 illustrates a semiconductor packaged device 41 including a package assembly 43 in which a semiconductor die or chip 59 is housed. The package assembly 43 includes a generally annular package ring 45 formed from a molding compound such as epoxy Novolac. Opposite axial ends of the package ring 45 are closed by metal (copper in the disclosed example) lids 47 and 49 which also function as heat spreaders. Referring to FIGS. 4A and 4C, the outer peripheral portions of the lids 47 and 49 are adhered to the package ring 45 by layers of adhesive material 51. Flame plasma deposited film coatings 53 and 55 are respectively provided on lids 47 and 49 to enhance the adhesion of the adhesive layers 51 to the lids 47 and 49. Thus, the adhesion of the lids 47 and 49 to the molded package ring 45 is also enhanced.

Referring to FIG. 4B, a metal (in this embodiment aluminum) die pad 57 is provided to support the chip or die 59 within the package assembly 43. Using layers of a thermally enhanced epoxy adhesive material 52, the die pad 57 is adhered on one side thereof to the lid 47 (or alternatively the lid 49), and on the opposite side thereof to the die 59. A flame plasma deposited film coating 61 covers both of the aforementioned sides of the die pad 57 to enhance the adhesion of the adhesive layers 52 to the die pad 57. Thus, the adhesion of the die 59 and the lid 47 to the die pad 57 is enhanced. In addition, the adhesion between the die pad 57 and the lid 47 is further enhanced by the flame plasma deposited film coating 53 on the lid 47, which coating 53 enhances the adhesion of the adhesive material 52 to the lid 47.

The package ring 45 and the lids 47 and 49 are cooperable to define a cavity 67 within the package ring 45 and between the lids 47 and 49. Alternatively, the package ring 45 and the adhered lid 49 can be considered to define a die carrier body having an outwardly opening cavity 67 which is closed by the lid 47. As indicated above, the die 59 may be mounted on either of the lids 47 or 49. The package ring 45 is molded onto leads such as lead 63. The lead 63 has an inner end which is disposed within the cavity 67 and wire bonded at 65 to the die 59. The lead 63 extends outwardly through the package ring 45 to provide external electrical access to the die 59.

In the embodiment of FIG. 4, the flame plasma deposited coatings 53, 55 and 61 may be either electrically conductive or insulative (if the coating 55 is insulative, it will prevent the bond wires from shorting to the lid 49), and may have the same thickness and adhesion strength as disclosed above with respect to the coating 23 of FIG. 1. Because the coatings of FIGS. 4A-4C are provided to enhance the adhesion of the adhesives to the die pad 57 and to the lids 47 and 49, the desired adhesion strength must be provided at the interfaces between the die pad 57 and the coating 61, at the interfaces between the coatings 53, 55 and the lids 47, 49, at the interfaces between the coatings and the adhesives, and within the coatings themselves.

Figure 5:
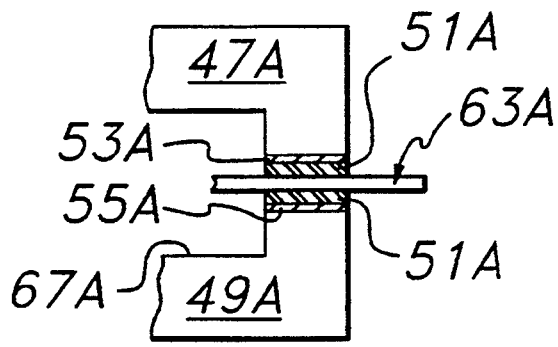
FIG. 5 is a fragmentary side view of another integrated circuit device package according to the invention.

FIG. 5 illustrates an alternative to the FIG. 4 embodiment. FIG. 5 is generally similar to FIG. 4 but differs therefrom because it does not include a molded package ring as in FIG. 4. A metal base or die carrier body 49A defines an outwardly opening cavity 67A which is closed by a metal lid or cap 47A. The base 49A and the cap 47A may be, for example, aluminum. The opposed outer peripheral portions of the cap 47A and the base 49A are adhered to one another by adhesive material 51A. The lead 63A is captured between the cap 47A and the base 49A, and is adhesively secured in place by the adhesive material 51A. The flame plasma deposited film coatings 53A and 55A are respectively provided on the opposed outer peripheral portions of the cap 47A and the base 49A to enhance the adhesion of the adhesive material 51A to the cap 47A and the base 49A. Similarly to the FIG. 4 embodiment, a semiconductor die is disposed within the closed cavity 67A, and may be mounted on either the base 49A or the cap 47A.

Figure 6:
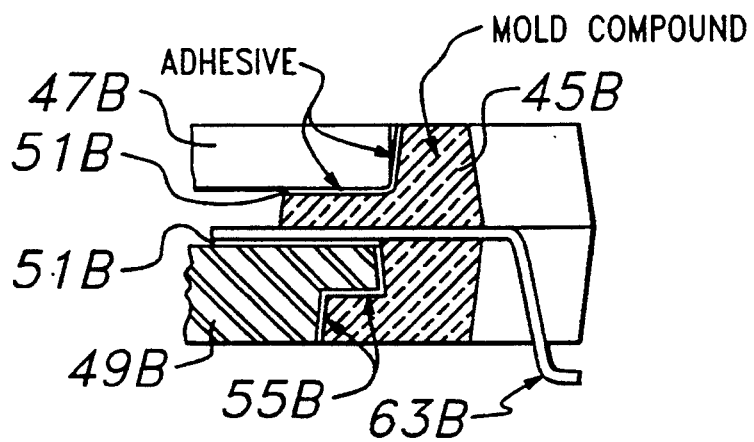
FIG. 6 is a view similar to FIG. 5, but depicting another integrated circuit device package according to the invention.

FIG. 6 illustrates another alternative to the FIG. 4 embodiment. FIG. 6 is generally similar to FIG. 4 but differs therefrom because the molded package ring 45B is molded onto the heat spreader 49B as well as the leads 63B. The leads 63B are attached to the surface of heat spreader 49B by adhesive 51B, and thereafter the package ring 45B is molded onto the heat spreader 49B and the leads 63B. The surface of heat spreader 49B is provided with a flame plasma deposited coating 55B to enhance the adhesion between heat spreader 49B and package ring 45B. The adhesion between adhesive 51B and heat spreader 49B is also enhanced by the flame plasma deposited coating on the heat spreader. As in FIG. 2, the coating on heat spreader 49B can be electrically insulative (such as alumina) to prevent the leads 63B from being shorted together by the metal heat spreader 49B, or the adhesive 51B can be an insulating tape with adhesive on both sides.

After the package ring 45B has been molded onto the heat spreader 49B and leads 63B, the lid 47B is attached to the package ring 45B using adhesive 51B.

Referring now to FIGS. 1, 4, 5 and 6, the leads illustrated therein may also be coated with flame plasma deposited material as discussed above with respect to FIGS. 2 and 2A. Such lead coating enhances the adhesion between: the leads 21 and molding compound 19 of FIG. 1; the leads 63 and the molded package ring 45 of FIG. 4; the leads 63A and adhesive material 51A of FIG. 5; the leads 63B and molded package ring 45B of FIG. 6; and the leads 63B and adhesive 51B of FIG. 6. As is clear from the drawings, the flame plasma deposited coating need only be applied to those portions of the leads which contact the molding compound and/or the adhesive. Such selective coating is readily achieved using conventional masking techniques.

Figure 7A:
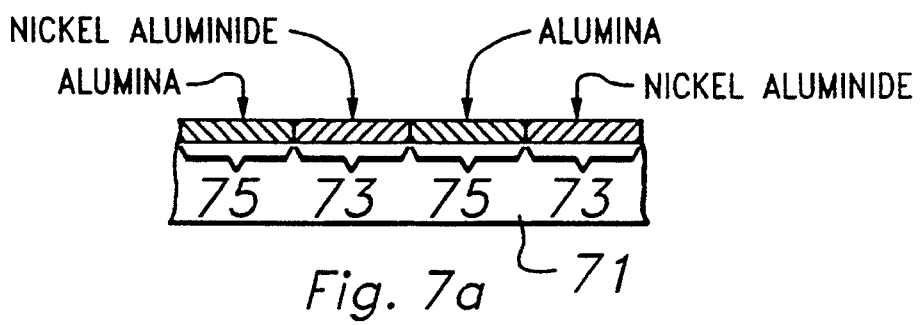
FIGS. 7A and 7B illustrate a metal component of a molded package coated with a combination of selectively applied coating materials.
Figure 7B:
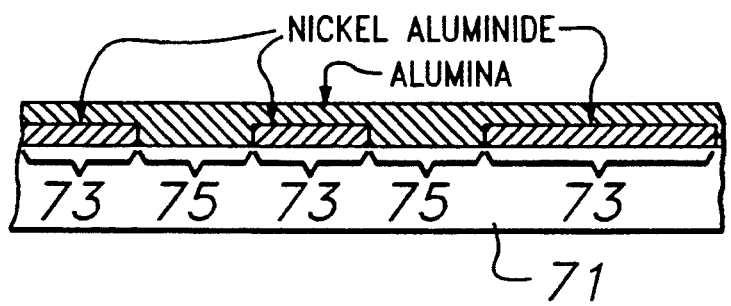

Coatings such as the exemplary coatings described herein can be used together in selective combination, depending on the requirements of the particular package. As an example, referencing FIG. 7A, nickel aluminide can be applied only on selected areas 73 of a surface of a metal component 71 such as a heat spreader, and alumina can be applied to the remaining areas 75 which are not already coated with nickel aluminide. This provides minimal deposition thickness and improved thermal conductivity in the electrically insulative areas 75. As another example, referencing FIG. 7B, the alumina can be applied over the entire surface of the metal component 71, including the nickel aluminide-coated areas 73 and the areas 75. The areas 75 have greater dielectric strength than the areas 73 while having a deposition thickness approximately equal to the deposition thickness of the areas 73.

Although exemplary embodiments of the invention are described above in detail, this description is not to be construed as limiting because the invention can be practiced in a variety of embodiments.

What is claimed is:

1. A method of manufacturing a semiconductor packaged device, comprising the steps of:
    providing a metal heat spreader for carrying heat out of said semiconductor packaged device;
    providing a molding compound to be adhered to the heat spreader;
    enhancing the adhesion capability of the heat spreader by using flame plasma deposition to apply a coating to a surface of the heat spreader; and
    thereafter, applying to the coated surface of the heat spreader the molding compound.

2. The method according to claim 1, including the step of mechanically abrading said surface before applying said coating thereto.

3. The method according to claim 1, wherein the semiconductor packaged device comprises:
    a semiconductor chip support pad, the molding compound is molded onto the chip support pad;
    a semiconductor circuit chip mounted on the chip support pad.

4. The method according to claim 1, wherein the molding compound is a plastic material.

5. The method according to claim 4, wherein the plastic material is epoxy Novolac.

6. The method according to claim 1, wherein the coating is electrically conductive.

7. The method according to claim 6, wherein the coating is nickel aluminide.

8. The method according to claim 1, wherein the coating is insulative.

9. The method according to claim 8, wherein the coating is alumina.

10. The method according to claim 1, wherein the coating has a thickness in a range of approximately 0.001 to 0.005 inches.

11. The method according to claim 1, wherein the coating has an adhesion strength of approximately 1000 psi.

12. The method according to claim 1, wherein the coating includes a precoat layer of nickel aluminide and an overcoat layer of alumina applied over said precoat layer.

13. The method according to claim 1 further comprising:
    providing a plurality of leads connected to the semiconductor packaged device;
    attaching the leads to the heat spreader, the coating on the surface of the heat spreader being electrically insulative such that the leads are electrically isolated from one another; and
    forming the molding compound onto the leads such that the leads project exterior to the molding compound to provide external electrical access to the semiconductor packaged device.

14. The method according to claim 13 further comprising enhancing the adhesion capability of the leads by using flame plasma deposition to apply a coating to a surface of the leads.

15. A method for manufacturing an electrical circuit assembly, comprising:
    forming a molded casing on an electrical circuit;
    using flame plasma deposition to apply a coating on a surface of a metal heat spreader;
    adhering the molded casing to the coated surface of the metal heat spreader, whereby the coating on the surface of the heat spreader enhances the adhesion between the heat spreader and the molded casing.

16. The method of claim 15 wherein the coating on the surface of the metal heat spreader is conductive.

17. The method of claim 15 wherein the coating on the surface of the metal heat spreader is insulative.

18. The method of claim 15 wherein the molded casing is a plastic material.

19. The method of claim 15 wherein first portions of the coating on the surface of the metal heat spreader are conductive and second portions of the coating on the surface of the metal heat spreader are insulative.

* * * * *